United States Patent [19]
Spiess

[11] Patent Number: 5,889,818
[45] Date of Patent: *Mar. 30, 1999

[54] ADAPTIVE DISPLAY REFRESH AND DATA COMPRESSION IN A RADIO FREQUENCY ENVIRONMENT

[75] Inventor: Gary N. Spiess, Lisbon, Iowa

[73] Assignee: Norand Corporation, Cedar Rapids, Iowa

[ * ] Notice: The term of this patent shall not extend beyond the expiration date of Pat. No. 5,592,512.

[21] Appl. No.: 536,814

[22] Filed: Sep. 29, 1995

Related U.S. Application Data

[63] Continuation-in-part of Ser. No. 270,239, Jul. 1, 1994, Pat. No. 5,592,512, which is a continuation-in-part of Ser. No. 265,712, Jun. 24, 1994, abandoned.

[51] Int. Cl.[6] ...................................................... H03M 7/30
[52] U.S. Cl. .............................. 375/240; 341/51; 341/55; 341/87; 341/106
[58] Field of Search ...................................... 375/240, 259, 375/377; 341/51, 55, 59, 63, 67, 87, 95, 99, 106, 107; 358/426, 261.1, 261.2, 261.4; 348/384, 400; 370/474, 476, 477

[56] References Cited

U.S. PATENT DOCUMENTS

| | | | |
|---|---|---|---|
| 4,701,745 | 10/1987 | Waqterworth | 340/347 DD |
| 4,899,147 | 2/1990 | Schiavo et al. | 341/60 |
| 4,926,482 | 5/1990 | Frost et al. | 381/31 |
| 4,971,407 | 11/1990 | Hoffman | 341/87 |
| 5,016,009 | 5/1991 | Whiting et al. | 341/67 |
| 5,048,104 | 9/1991 | D'Aoust et al. | 382/46 |
| 5,051,745 | 9/1991 | Katz | 341/51 |
| 5,300,931 | 4/1994 | Lindsay et al. | 341/106 |

*Primary Examiner*—Amanda Le

[57] ABSTRACT

An adaptive display refresh and data compression solution for use in an RF network environment is described, where a network controller and portable terminals maintain an adaptive history of commonly used past information in order that it may be repeated quickly and communication speeds can be increased. A network controller maintains a separate history for each of the terminals in the RF network, and transmits a coded reference for the activities that are contained in the history, which is stored in the memory of both the controller and the portable terminal. Terminals and the controller additionally may negotiate to determine the data compression features which will be supported in communication between the two devices. Data is compressed according to the present invention by utilizing a hybrid run length and sliding dictionary compression scheme. Data is precompressed by a run length compressor, and is further compressed by a specialized sliding dictionary technique designed to minimize memory storage and transmission time requirements, resulting in an efficient data compression method requiring little additional storage.

20 Claims, 6 Drawing Sheets

ADAPTIVE DISPLAY REFRESH AND DATA COMPRESSION IN A RADIO FREQUENCY ENVIRONMENT

CROSS REFERENCE TO RELATED APPLICATIONS

This application is a continuation-in-part of U.S. application Ser. No. 08/270,239, filed Jul. 1, 1994, now U.S. Pat. No. 5,592,512 issued Jan. 7, 1997 (Attorney Docket No. 38076A), which in turn is a continuation-in-part of U.S. application Ser. No. 08/265,712, filed Jun. 24, 1994 (Attorney Docket No. 38076), now abandoned.

AUTHORIZATION PURSUANT TO THE COMMISSIONER'S NOTICE

OF MAR. 20, 1987 (1077 OG 22)

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The present invention relates generally to adaptive data compression and more particularly to a method of updating display histories and determining data compression features to implement in a radio frequency communication system. The present invention also relates to a method for compressing data in a radio frequency communication system designed to minimize storage requirements.

BACKGROUND OF THE INVENTION

Radio frequency (RF) communication systems, particularly in the context of communication involving portable, battery-powered terminals, have always had to deal with slow communication speeds. In an application environment, data is communicated between portable terminals, network controllers, and host computers, for example. In order for a system to truly be a "real-time" system, there cannot be any significant delay in operation when data communication takes place.

In a typical RF system, it can take approximately two milliseconds to transmit a character of information. In order to fill even a relatively small portable screen with characters, it can take approximately one second. When fragmentation into packets and packet overhead time is taken into account, the time required to refresh a full screen of information is well over a second, which results in a noticeable delay for an end user. Such a delay has a negative effect on the user's time productivity, and also on the overall ease of use and comfort with the communication system.

There have been a number of attempts to solve the problems created by insufficient communication speed. One such solution is known as "mirroring." This approach is implemented by having a network controller "mirror" a portable terminal's display image in its memory. When the display screen needs to be updated, the controller transmits only the changes from the current screen, rather than transmitting the entire new screen information. This approach gives a portable terminal the ability to redisplay the same screen or a similar screen very quickly.

There are many drawbacks to the mirroring solution. By requiring both a controller and a portable terminal to have a display in memory, applications which run terminal emulation must have coded versions of the emulation software in both the terminal and the controller. New terminal emulations would need to be coded twice to obtain mirroring benefits. Also, it is extremely difficult to keep the functionality of a controller in sync with the functionality of one or more portable terminals. If these devices are not in sync, the mirroring solution does not work at all. Finally, even if the mirroring is working perfectly, there is no way to toggle between two or three display screens quickly, which is useful in many applications.

Another possible solution is known as a "static dictionary" approach. A network controller can be pre-loaded with certain display screens that may be utilized most often in portable terminals, and these screens can be forwarded to the terminals. Whenever a portable terminal requires a new display screen that is among the pre-loaded screens, the controller can transmit a reference, such as a number, which tells the terminal to use the appropriate screen, which is already in its memory. This approach allows a portable terminal to completely change from a current display to another display in a fraction of the time otherwise required.

However, there are also some negative factors associated with the static dictionary solution. The main problem with this approach is that someone must decide initially which display screens are the most probable in the application environment, to pre-load into the controller. This pre-loading must be done differently for each individual application in order to attempt to pre-load the most frequently occurring screens for each application. Also, any time the pre-loaded screens need to be changed, the controller must be manually reprogrammed.

Static dictionary solutions also provide only one set of display screens, known as a "history," in the controller's memory for all terminals. Modifying this solution to be adaptive would require the controller to transmit dictionary updates to every portable terminal, which would substantially reduce the benefits of implementing the compression in the first place. Neither the mirroring approach, the static dictionary approach, nor a static dictionary approach modified to be adaptive completely satisfy the objectives of data compression in a radio frequency communication system.

Another problem with data compression in a radio frequency communication system is the inflexibility of data compression features between different devices. There are multiple data compression techniques, and communication devices generally support only one or a limited number of them in combination. It is often the case that a device attempting communication will only execute data compression in its transmission if the receiving device supports the exact same data compression technique, or the same combination of techniques.

As a result, two differently configured devices will communicate with no data compression at all, when it is possible that they may both support some of the same data compression features, but with a different combination.

There have been many attempts to compress data so as to reduce communication times. Some of the resulting technologies are referred to as bit-oriented techniques, such as Huffman, Arithmetic, or Shannon-Fano encoding. With these schemes, the number of bits used to represent a code element vary in inverse proportion with the frequency of usage. The space character, for example, may only take 1 bit to encode, and the 'Q' character may take 23 bits to encode. These techniques are often used in conjunction with other methods to achieve significant compression ratios.

However, without hardware support, the receiving processor has to inspect each bit of the compressed data to determine what it means. The data is looked up in a binary tree until a leaf has been found in the tree, and the represented code can be determined. In an adaptive compression scheme, the expansion process must also adjust the binary tree for every character decoded. All this data manipulation takes a significant amount of time and memory, which is not acceptable in a radio frequency "real-time" communication system.

Another technique for compressing data is known as a sliding dictionary scheme. While the data is being compressed, a certain amount of past uncompressed data is searched for a match to what is about to be compressed. If no match is found, one character is output and the search for a match begins again with the next input character. When a match is found, a pointer to the previous uncompressed stored data and its length is output instead. During expansion, each character is inspected to determine if it represents a pointer. If not, the character is transferred to the output unchanged. If it is a pointer, it is used to point back into the uncompressed stored data, and the data is copied to the output.

Sliding dictionary compression can be extremely slow when it is searching for a match. Special techniques are required to speed up the search for a match. Also, there are a large number of flags in sliding dictionary compressed data, and an entire 8-bit character is transmitted every time a flag is transmitted. This occupies significant space in a transmission which is not directly related to data, and is inefficient.

Thus, there is a need for a display refresh and data compression solution that flexibly and efficiently minimizes the effects of slow transmission speeds on operation of a radio frequency communication system. There is also a need for a data compression solution that is fast, efficient, and requires a relatively small amount of memory.

An object of the invention is to provide a display refresh and data compression solution that decreases operating delay for a user of a portable terminal in a radio frequency communication system.

Another object of the invention is to provide a display refresh and data compression solution that decreases average screen update time without requiring terminal emulation coding in both a network controller and a portable terminal.

Yet another object of the invention is to provide a display refresh and data compression solution that is adaptable to decrease average screen update time in a variety of diverse applications without manual reprogramming.

A further object of the invention is to provide a display refresh and data compression solution that eliminates the need to transmit dictionary updates to all portable terminals.

A still further object of the invention is to provide a data compression solution that allows communication devices to execute data compression even when they are not configured with all of the exact same compression features.

An object of the invention is to provide a data compression solution that requires a minimal amount of memory in the place of expansion, such as a portable terminal.

Another object of the invention is to provide a data compression solution that utilizes communication bandwidth efficiently to directly communicate data information.

Yet another object of the invention is to provide a data compression solution that speeds up the search for a match in a sliding dictionary compression scheme.

SUMMARY OF THE INVENTION

The present invention solves many of the foregoing problems in the art through the implementation of an adaptive display refresh and data compression solution. A radio frequency communication system of the present invention may comprise multiple portable terminals, a network controller, and a host computer. Data is transmitted from portable terminals, though the network controller, to the host computer, and vice versa. The displays of the portable terminals are updated according to the information received by the controller from the host computer.

In one embodiment of the present invention, the network controller stores a dictionary, or history, of the display strings most commonly used in each portable terminal. A display string is a sequence of characters that represents a portion of a display image or a command sequence that may, for example, be required to format a display or print image. The dictionary of strings allows the controller to transmit a short, reference code, such as a letter, to a portable terminal to indicate that the corresponding stored string is to be displayed or implemented on the terminal. By doing so, the amount of information which needs to be transmitted is significantly reduced. The dictionary of display strings also may change, according to the specific characteristics of the application environment in which the communication system is being used. If a display string is being used more often than one of the strings stored in the dictionary, the more probable string is loaded into the controller's memory to replace the less probable string. In this way, the communication system can adapt to any of a range of diverse applications, while still providing efficient data compression and display refresh features.

A separate history is maintained in the controller for each terminal in the system, which eliminates the need to send dictionary updates to every terminal in the network. When a new display string is to be kept in a terminal's history, that change can be transmitted to the terminal individually, affecting none of the other terminals. While such a comprehensive list of terminal histories occupies more memory in the network controller, the memory taken up is no more than is commonly used in a "mirroring" approach, and yields substantial data compression benefits.

It is also possible, according to the present invention, for the controller to remember not only strings of data, but also common command and print sequences executed by a portable terminal. Where an application requires repetitive actions to be performed by terminals, keeping such a command history can result in noteworthy time savings.

Another embodiment of the present invention allows a portable terminal and a network controller to negotiate between themselves which data compression features to utilize. For example, a terminal may only use one data compression feature, while a network controller is configured to use a combination of three data compression features. The terminal and the controller can negotiate and agree to use only the data compression feature supported by both of them, so that the maximum amount of data compression is performed in their communication. The size of the history to be maintained and the method of saving old and new strings in the history may also be negotiated. The negotiation process may occur between the controller and any of the portable terminals, so that in fact the controller may communicate with different terminals using different data compression features.

Data is compressed according to the present invention by implementing a hybrid compression scheme. Data to be transmitted first is compressed according to a run length compression technique. Repeated characters are detected and are reformatted by the run length technique as a flag followed by a count of the number of repetitions. Use of this "pre-compression" technique makes it unnecessary to spend processing time on long strings of repeated characters in a primary compression scheme.

The present invention further compresses data via a sliding dictionary type of technique. If a character is occurring for the first time in a data stream, then it can merely be transmitted as is, and is stored in a dynamic dictionary. If a character is occurring that has occurred before and is therefore stored in the dictionary, then it can be transmitted as a pointer to the location in the dictionary where it was originally stored. When the data is expanded, a pointer can be decoded by implementing a lookup, which saves additional decoding time. Also, there is no need to transmit dictionary updates for this sort of transmission, since the expansion of data creates the same dictionary created by compression.

Flags must accompany the compressed data to indicate whether a particular element is a character or a pointer. Rather than transmitting a full flag whenever there is a pointer, an additional bit may preferably be added to each data element, indicating whether it is an uncompressed character or a pointer to the dictionary. Data may further be transmitted as a set of elements, where the first element is an accumulation of all of the additional flag bits indicating the nature of the following elements which make up the set.

Data must be formatted and fragmented into packets for transmission in a wireless communication system. According to the present invention, data is also compressed in the fragmenting operation, which allows the data to be manipulated all at once and thereby saves time and reduces the need for additional formatting. Similarly, expansion of data preferably takes place as part of the same step as reassembly of data packets in a receiving device.

Other objects, advantages, and novel features of the present invention will become apparent from the following detailed description of the invention when considered in conjunction with the accompanying drawings.

DETAILED DESCRIPTION OF THE INVENTION

Figure 1:
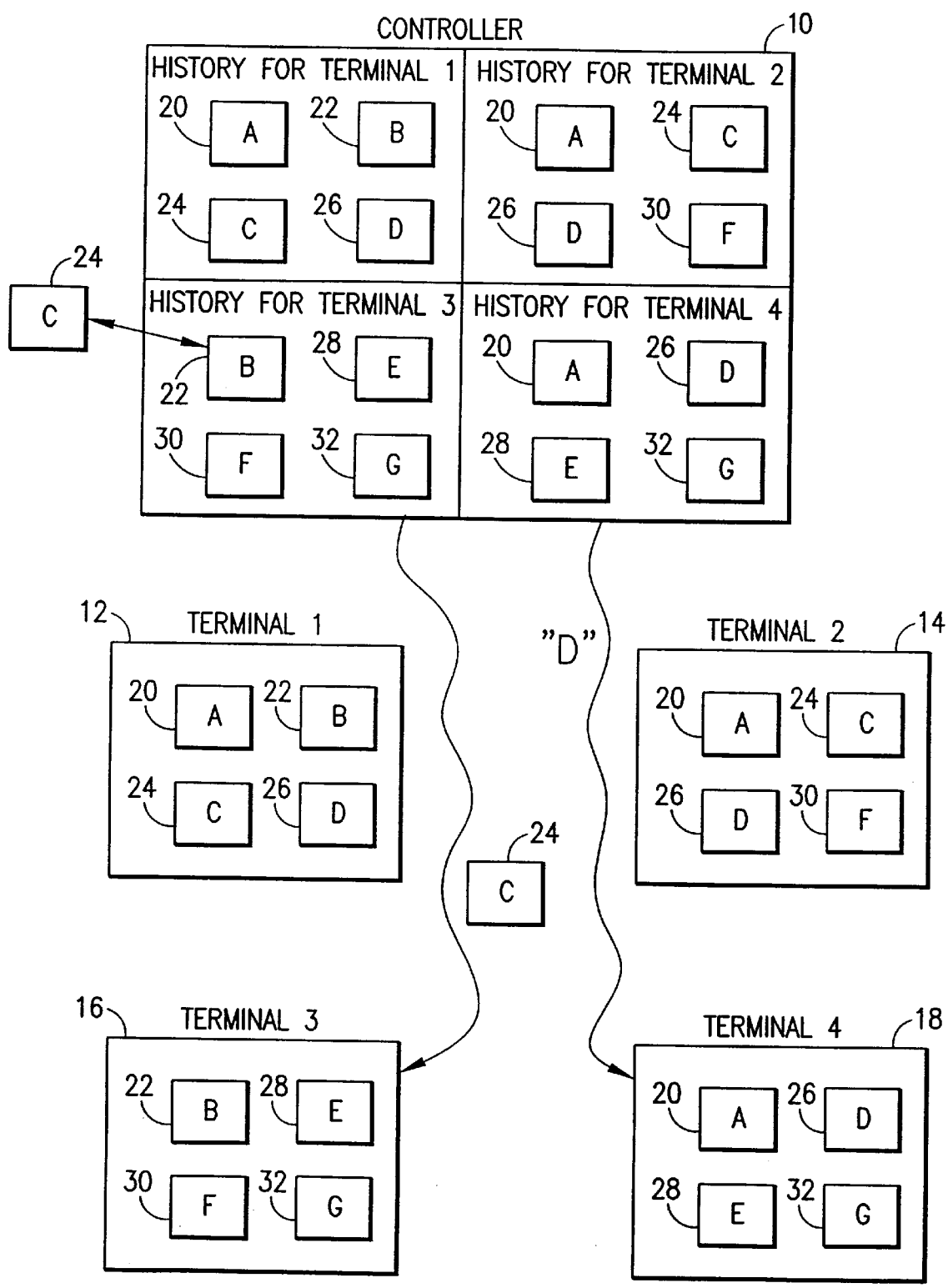
FIG. 1 is a block diagrammatic illustration of a controller and portable terminals in an RF communication system utilizing display refresh and data compression according to the present invention.

Referring now to the drawings, FIG. 1 is a block diagram of a network controller 10 and portable terminals 12, 14, 16, and 18 in an RF communication system. According to one embodiment of the present invention, the controller 10 stores in its memory a display history for each of the portable terminals 12, 14, 16, and 18. For example, the history for terminal 12 consists of detailed display information for a string A (20), a string B (22), a string C (24), and a string D (26). That display history is stored in both the controller 10 and the terminal 12.

Similarly, the history for terminal 14 consists of display information for a string A (20), a string C (24), a string D (26), and a string F (30), which is all stored in controller 10 and in terminal 14. The history for terminal 16 consists of display information for a string B (22), a string E (28), a string F (30), and a string G (32), which is all stored in controller 10 and in terminal 16. The history for terminal 18 consists of display information for a string A (20), a string D (26), a string E (28), and a string G (32), which is all stored in controller 10 and in terminal 18.

When the string to be displayed on a terminal corresponds to one of the display strings stored in the memory of the controller 10 for that particular terminal, the controller can transmit a short reference code, such as a letter, to indicate to the terminal that the appropriate string is in the terminal's memory. For example, if the next string to be displayed on terminal 18 was string D (26), which is stored in the history for terminal 18 in the controller 10 and in the terminal 18, the controller 10 would simply transmit a reference code "D" to the terminal 18 to indicate that the display information was stored in the memory of terminal 18 under that reference code. As a result, the controller 10 does not have to send all of the display information over the airwaves, and the information can be accessed much more quickly by the terminal 18.

The present invention also provides adaptive history capability. If, for example, portable terminal 16 reached the point where it was using a string C (24) more often than a string B (22) stored in its display history, the controller 10 could replace the string B (22) in its stored history with the string C (24), and could transmit the display information for the string C (24) to the terminal 16 with instructions to store string C (24) in the history of terminal 16 in the space formerly occupied by string B (22). None of the other terminals 12, 14, or 18 would be affected by the history change. In this way each terminal can have an up to date list of the most commonly used display strings in its history.

According to another embodiment of the present invention, the histories stored in the controller 10 for each terminal may be not only display information, but also command and print sequences for instance. A terminal could implement a commonly executed command sequence by looking it up in its history in response to a short instruction from the controller 10, thereby saving the time required to receive the sequence of commands or print sequences over a radio frequency link. The command sequences can be adaptively updated in a manner similar to the updating of display strings explained above.

The actual display information in controller 10 is preferably stored in a common memory (not shown) of the controller 10, and the 'display strings' represented in controller 10 in FIG. 1 are merely reference codes which refer to the actual display or command sequence information for each string stored in the corresponding location of the memory in controller 10. Each history may preferably be implemented in the controller 10 by an array of memory lookup codes such as A through G in FIG. 1.

While FIG. 1 shows the RF network with only four portable terminals, and shows each history consisting of only four items, it is understood that the present invention is applicable to networks and histories of any size, and FIG. 1 serves not to limit, but to give an example of the present invention.

In a preferred embodiment of the present invention, histories of display strings are not transmitted as a separate, independent function, but instead represent compressed or uncompressed data that each terminal needs to perform its functions, accompanied by proper formatting and instructions to be processed by the terminal to maintain a history according to the present invention.

Figure 2:
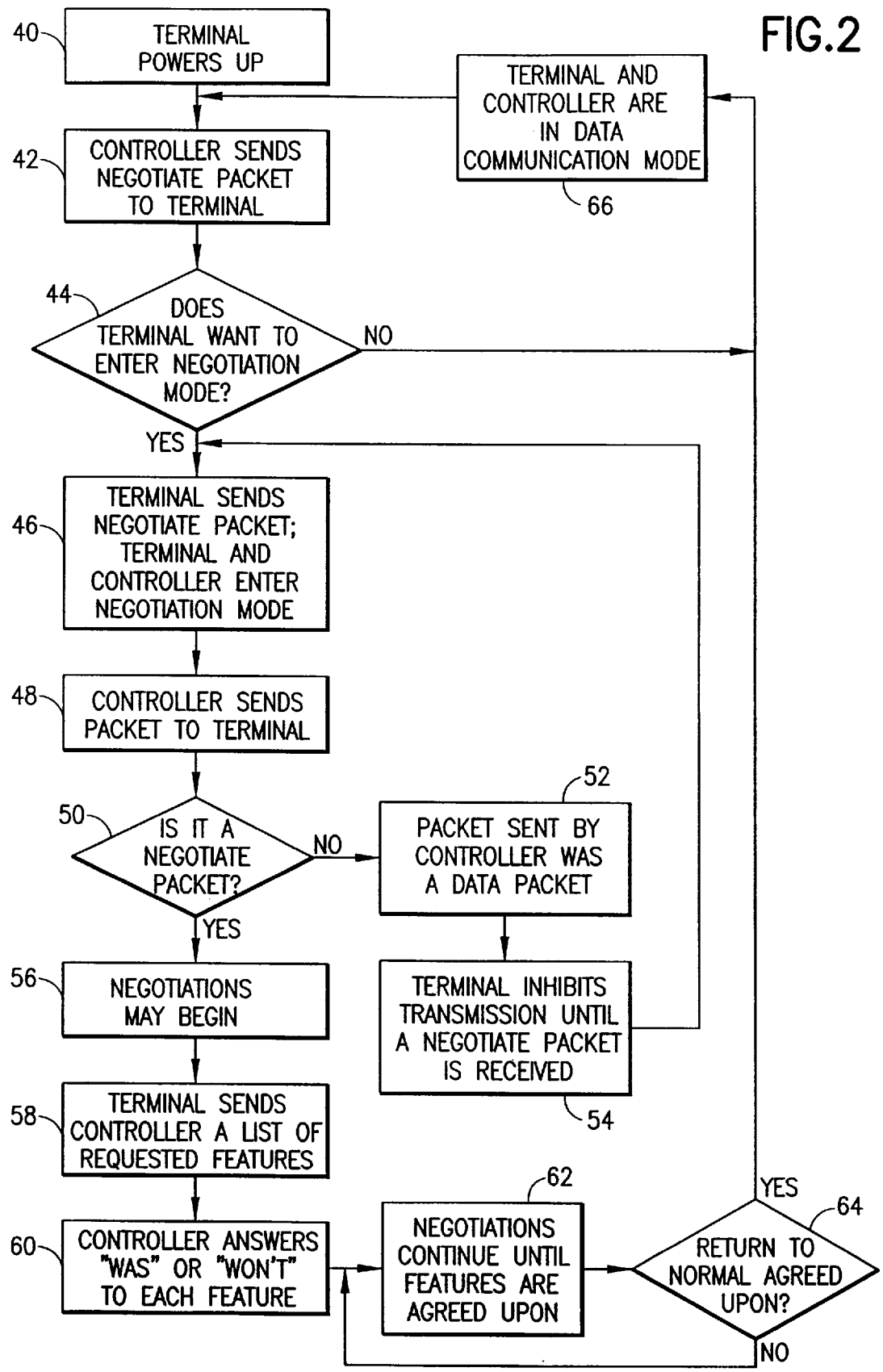
FIG. 2 is a flow diagram of the negotiation process executed between a controller and a portable terminal according to an embodiment of the present invention.

FIG. 2 is a flow diagram of a process which could be implemented by a portable terminal such as 12 (FIG. 1) and a network controller such as 10 (FIG. 1) to negotiate and establish data compression parameters in an RF communication network, according to an exemplary embodiment of the present invention. A terminal initially powers up in box 40. Upon detecting a new terminal in the network, the network controller transmits a negotiate packet to the terminal in box 42. This negotiate packet may for example be an empty packet, or may be a specially configured packet. If the terminal desires to enter into negotiation mode, at decision box 44, it responds by transmitting a negotiation packet back to the controller at box 46. The terminal and controller are then both in negotiation mode. The terminal waits for the controller to transmit a packet at box 48. If the packet is a negotiation packet, then negotiations may begin at box 56. If the packet is a regular data packet, as shown in box 52, then the terminal processes the packet but inhibits transmission at box 54 until a negotiation packet is received. Transmission in response to the data packet does not occur until the terminal and controller have finished negotiations.

After negotiations may begin, at box 56, the terminal transmits a list of requested data compression features to the controller at box 58. It is possible that the terminal and controller will support different data compression features, so they negotiate to determine which features are supported by both. The controller answers either "WILL" or "WON'T" to each of the features suggested by the terminal in box 60. The controller may then propose a list of further data compression features, or may otherwise continue negotiations with the terminal generally in box 62. This will continue until a list of features is agreed upon and a "return to normal" message is agreed upon in box 64. The controller and terminal may transmit back and forth in the negotiation process before they can agree on a set of features and agree to return to normal data communication mode. The controller and terminal then return to data communication mode in box 66, which continues until the controller and terminal decide to enter negotiation mode at a later time. It is also conceivable that the terminal may initiate the process to enter negotiation mode rather than the controller, in another alternate embodiment of the present invention. The end result is for a terminal and controller to select the most efficient data compression feature combination supported by both devices, to optimize average communication speed in an RF network environment In a communication system specifically designed to allow real-time channel negotiation, messages can be "piggybacked" on the end of regular data packets without having to enter a special mode of operation. Data compression features can be negotiated in such a system as well.

Figure 3:
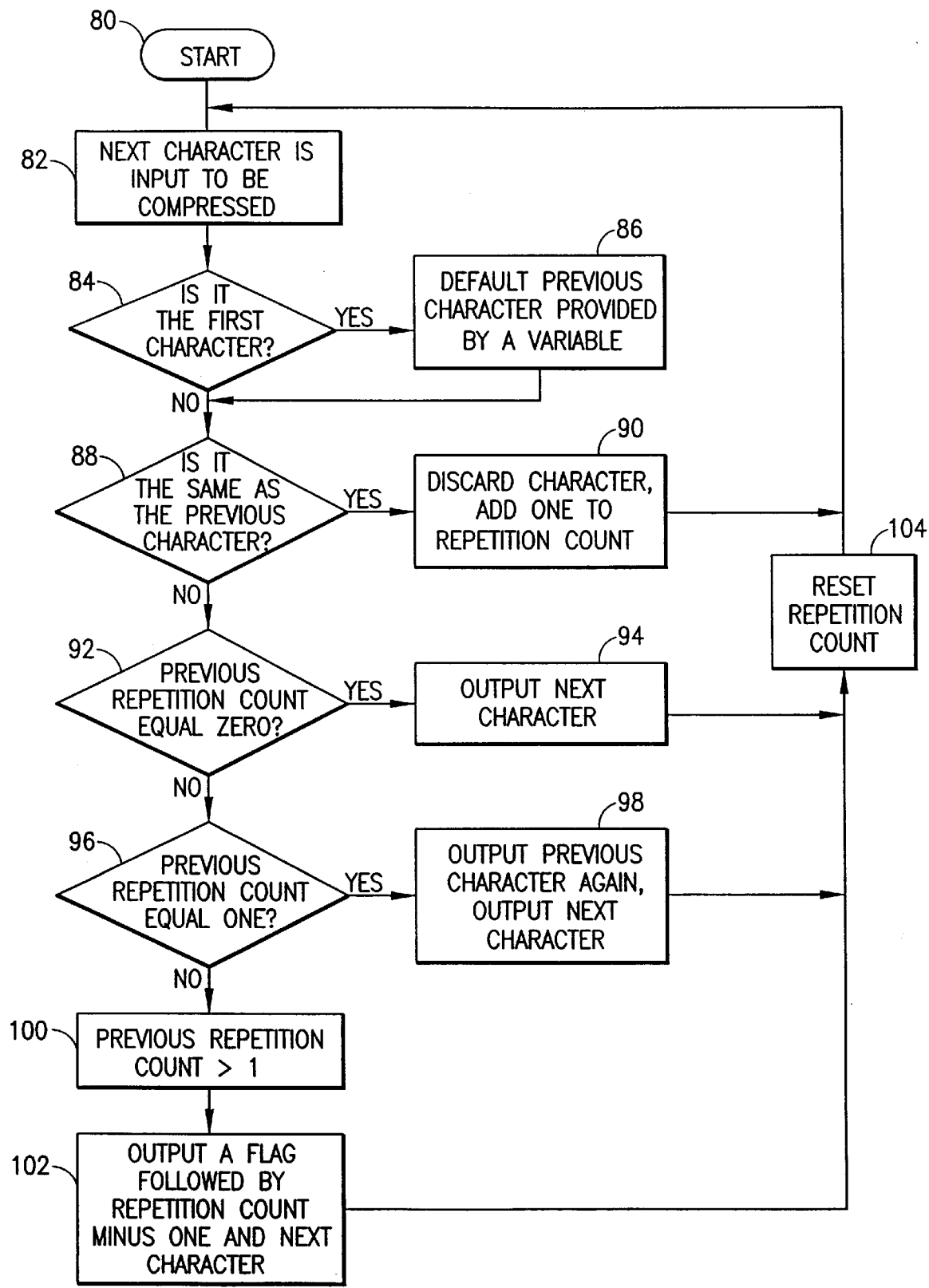
FIG. 3 is a flow diagram of the run length compression technique utilized to pre-compress data according to the present invention.

FIG. 3 is a flow diagram of a possible run length data compression technique which could be implemented according to an embodiment of the present invention. A data stream is input to the run length compressor which begins the compression process at start box 80. The next character to be compressed is input to the run length compressor at box 82. If the character is the first character of the data stream, as determined at box 84, then the previous character must be provided by a default variable, as indicated at box 86. The default variable contains the one character that is stored permanently in a dictionary, so that even the first character may possibly be a match. The next character is then compared to the previous character at box 88. If the characters are the same, then the character is discarded (not output by the run length compressor) and the repetition count is incremented by one at box 90, followed by input of another character to be compressed at box 82. If the characters are different, then the previous repetition count is examined. If the previous repetition count is zero at box 92, then the character is output from the run length compressor at box 94, followed by input of another character at box 82. If the previous repetition count is one at box 96, then the previous character is output again, and the next character is also output from the run length compressor. It is not efficient to represent a string of two characters as a character, flag, and a number, since it would require three elements to represent two. If the previous repetition count is greater than one at box 100, indicating that there has been at least three of the same character in a row, then a flag is output followed by the repetition count minus one, and the character is output, at box 102.

Any time the character input is different than the previous character, the repetition count must be reset, as indicated at box 104. The result of this entire process is to save transmission space and processing time for any additional compression schemes by condensing long strings of repeated characters into a small, easily readable code. For example, consider an input string of abbcccdddd. Proceeding through the flow diagram of FIG. 3, the output from the run length compressor would be abbc(flag)1d(flag)2. One element is saved by the run length technique. Now consider an input stream with long strings of spaces or carriage returns between characters. Significant time and processing savings can be achieved by outputting the actual characters only once, with a flag and the number of repetitions following, rather than outputting all of the repeated characters.

Figure 3A:
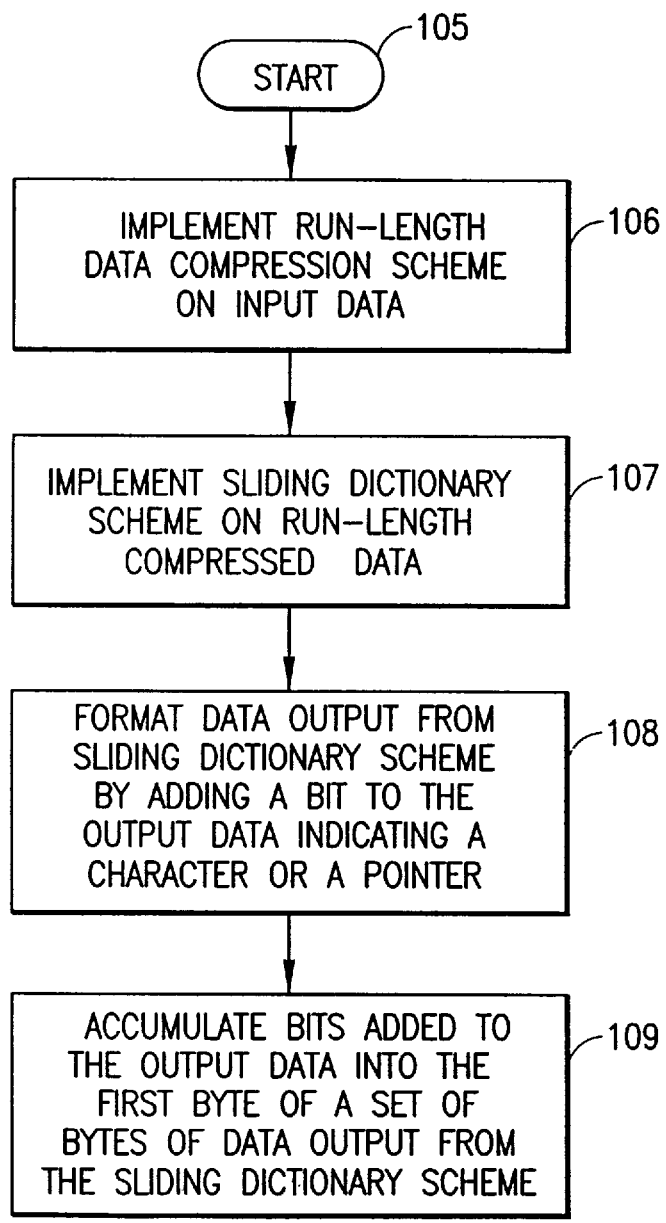
FIG. 3A is a flow diagram of the sequence of implementation of data compression schemes and formatting according to an embodiment of the present invention.
Figure 4:
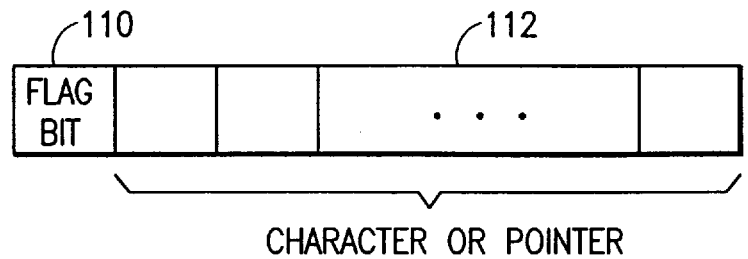
FIG. 4 is a diagrammatic illustration of a transmitted element including a flag bit according to the present invention.

FIG. 3A illustrates the sequence of data compression schemes and formatting techniques that are applied to compress data according to an embodiment of the present invention. A data stream is input to begin the compression process at start box 105. The input data is compressed by a run-length data compression scheme at box 106. The run-length compression scheme is preferably implemented as described in FIG. 3. Next, a sliding dictionary scheme, as described below with respect to FIG. 4, is implemented on the run-length compressed data at box 107. Then the data output from the sliding dictionary scheme is formatted by adding a bit indicating whether the data is a character or a pointer, as described below with respect to FIG. 4, at box 108. Finally, the added bits are accumulated into a first byte of a set of bytes of the data output from the sliding dictionary scheme, at box 109. At this point, the data has been fully compressed and is ready to be transmitted.

FIG. 4 illustrates an exemplary character or pointer representation according to an embodiment of the present invention. A sliding dictionary technique is preferably utilized to compress data after it has passed through the run length compressor. In a sliding dictionary scheme, a character that is input for the first time is transmitted uncompressed, while a character that has been input at some time previously is transmitted as a flag followed by a pointer which points to the memory location where that character is stored, in what is referred to as a "sliding" or dynamic dictionary. The present invention provides an additional flag bit 110 to the actual coded element 112 to indicate whether the element is a character or a pointer, which results in greater efficiency in recognizing different types of elements.

For example, consider an input string of abbcccddddefddddd. The output from the run length compressor, as described in FIG. 3, would be abbc(flag)1d(flag)2efd(flag)3. The sliding dictionary technique would further change the string to be ab(p.b)c(flag)1d(flag)2ef(p.d)(flag)3, where (p.char) represents a pointer that points to the location of char.

It is possible that the sliding dictionary may be responsive to recurring strings of characters rather than, or in addition to, characters themselves. In a situation where there are numerous recurring strings, this configuration may result in even more significant compression savings, since a string of characters can be transmitted as merely a single pointer.

Searching for matching characters in the sliding dictionary can be a long, slow process unless something is done to make it faster. A linear search would be extremely slow, and a binary tree would occupy too much memory. The best solution is to implement a hash table, whereby each character is stored in the sliding dictionary in a hash table, addressed according to properties of the character itself. When two characters are assigned to the same location in the hash table, a linked list is utilized to further store and locate the characters. If a potent hashing algorithm is used, the size of the hashing table can be extremely small while still yielding efficient search results.

Figure 5:
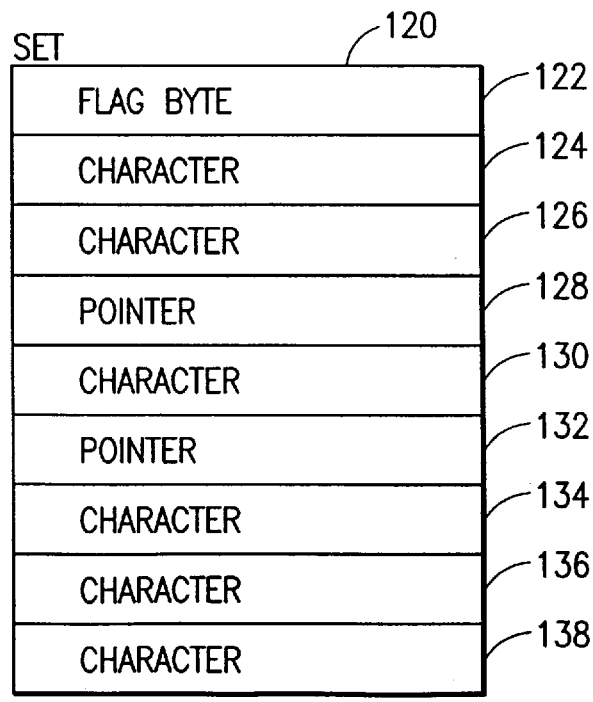
FIG. 5 is a diagrammatic illustration of a set of transmitted elements including a flag byte according to the present invention.

FIG. 5 illustrates an exemplary byte transmission configuration according to an embodiment of the present invention. A set of bytes 120 may be assembled, whereby the first byte of the set is a flag byte 122 which accumulates the additional flag bits 110 (FIG. 4) of the characters and pointers in the set. For example, if a '0' is used to represent a character and a '1' is used to represent a pointer, and bytes 124, 126, 130, 134, 136, and 138 are characters and bytes 128 and 132 are pointers, then the flag byte 122 would be 00101000. This saves significant space in transmitting the data, and reduces the amount of space used to represent flags rather than data itself.

Figure 6:
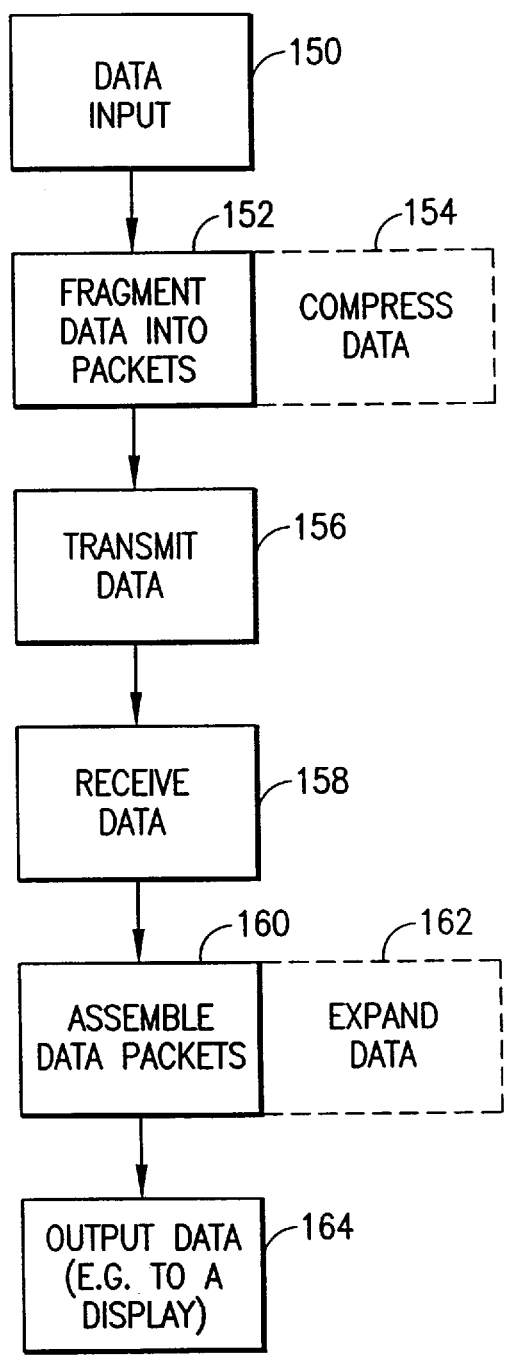
FIG. 6 is a block diagrammatic illustration of the path traveled by data in a wireless communication system and the location of data compression and expansion according to the present invention.

FIG. 6 shows a typical data transmission process according to the present invention. Data must first be input to the transmitting device, indicated by box 150. For example, data to be transmitted to a portable terminal in a wireless communication network could be input to a network controller by a host computer through an input buffer. The data is then prepared for transmission by the network controller by fragmenting it into smaller packets at box 152. Since the data is already being manipulated and reformatted, this is an ideal time to compress the data as well, as shown by box 154. Additional reformatting and other data handling can thereby be reduced. The formatted, compressed data is transmitted at box 156, and is received at box 158. In an exemplary embodiment, the transmitting and receiving is performed by a network controller, possibly through a radio base station or repeater, and a portable terminal, respectively. The data packets must then be reassembled at box 160. and again this is an ideal time to expand the data as well, as indicated by box 162, reducing reformatting and data handling. The resulting data is ready to be output, for example to a display, at box 164. The data could also be output to a printer, a speech synthesizer, or any other component which receives data as an input. In this way, data may be transmitted and received efficiently in a wireless communication system without requiring significant amounts of additional memory storage.

Appendices A–C illustrate exemplary source code for implementing the present invention, including run-length code, sliding dictionary code, and testing code. The Appendices are hereby incorporated herein in their entirety, and are made a part of this application.

It will be apparent to one skilled in the art having read the foregoing that various modifications and variations fall within the scope of the concepts and teachings of this disclosure, and it is intended to cover all such modifications and variations by the appended claims.

What is claimed is:

1. A method of compressing data comprising:
   (a) first implementing a run length compression scheme to output repeated characters in a stream of input data as flags followed by a count of the number of repetitions;
   (b) second implementing a sliding dictionary scheme to output a character itself if it is occurring for the first time in the stream of input data, and to output a pointer to a character sequence if the character sequence has already occurred in the stream of input data;
   (c) formatting the output of step (b) by adding an additional bit to each character or pointer to indicate whether it represents a character or a pointer;
   (d) accumulating the additional bits into a first byte of a set of data bytes to indicate whether each byte in the set is a character or a pointer, and
   (e) transmitting the first byte of additional bits, and then transmitting further bytes of the set which are indicated as a character or a pointer by the additional bits of the first byte, such that data communication speed is improved to enable real time communication with minimal memory storage used.

2. The method of claim 1, wherein data compression occurs in the same location as data packet fragmentation.

3. The method of claim 2, wherein data is compressed in a network controller of a wireless communication system.

4. The method of claim 1, wherein data expansion occurs in the same location as data packet assembly.

5. The method of claim 4, wherein data is expanded in a portable terminal of a wireless communication system.

6. A method of compressing data comprising:
   (a) effecting a compression step to output repeated characters in a stream of input data as flags followed by a count of the number of repetitions;
   (b) supplying as output a character itself if it is occurring for the first time in the stream of input data and supplying as output a pointer to a character sequence if the character sequence has already occurred in the steam of input data;
   (c) formatting the output of step (b) to indicate for a set of data bytes, whether each byte in the set is a character or a pointer, and
   (d) transmitting pointer information as a variable number of bytes adapted to the length of respective sequences.

7. The method of claim 6, wherein data compression occurs in the same location as data packet fragmentation.

8. The method of claim 7, wherein data is compressed in a network controller of a wireless communication system.

9. The method of claim 6, wherein data is compressed in a network controller of a wireless communication system.

10. The method of claim 6, wherein data expansion occurs in the same location as data packet assembly.

11. The method of claim 10, wherein data is expanded in a portable terminal of a wireless communication system.

12. The method of claim 6, wherein data is expanded in a portable terminal of a wireless communication system.

13. A data compression system comprising:
   (a) a data output processor capable of generating at least three different types of data output, wherein:
      the first data output compresses repeated characters in a stream of input data into a flag followed by a count of the number of repetitions in the stream,
      a second data output supplies the output of a character as itself if the character has occurred for the first time in the stream of input data, and
      a third data output supplies the output of a pointer of a variable number of bytes if a character sequence has already occurred in the stream of input data, and
   (b) a format indicator for determining and identifying one type of output from another.

14. The data compression system of claim 13, wherein data compression occurs in the same location as data packet fragmentation.

15. The data compression system of claim 14 wherein data compression occurs in a network controller of a wireless communication system.

16. The data compression system of claim 13 wherein data compression occurs in a network controller of a wireless communication system.

17. A data expansion system comprising:
   (a) a data processor capable of expanding at least three different types of compressed data, wherein:
      the first type of data represents a string of repeated characters and is comprised of a flag followed by a count of the number of repetitions in the string of repeated characters,
      the second type of data is comprised of a character represented as itself, and
      the third type of data is comprised of a pointer with different numbers of bytes which refers to the position and length of strings of characters in a stream of data, and
   (b) a format indicator for determining and identifying the second and third types of data.

18. The data expansion system of claim 17, wherein data expansion occurs in the same location as data packet assembly.

19. The data expansion system of claim 18, wherein data expansion occurs in a network controller of a wireless communication system.

20. The data expansion system of claim 17 wherein data expansion occurs in a network controller of a wireless communication system.

* * * * *